United States Patent
Niigaki et al.

(10) Patent No.: US 7,557,336 B2
(45) Date of Patent: Jul. 7, 2009

(54) PHOTODETECTOR HAVING FIRST AND SECOND ANTENNA AREAS WITH PATTERNS HAVING DIFFERENT CYCLE INTERVALS

(75) Inventors: Minoru Niigaki, Hamamatsu (JP); Toru Hirohata, Hamamatsu (JP); Hiroyasu Fujiwara, Hamamatsu (JP); Akira Higuchi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/798,040

(22) Filed: May 9, 2007

(65) Prior Publication Data

US 2007/0262239 A1    Nov. 15, 2007

(30) Foreign Application Priority Data

May 10, 2006   (JP)   ............ P2006-131728

(51) Int. Cl.
    *H01L 31/00*   (2006.01)
(52) U.S. Cl. ............. 250/214.1; 257/459; 257/448
(58) Field of Classification Search ......... 250/214.1; 257/448, 459
    See application file for complete search history.

(56) References Cited

U.S. PATENT DOCUMENTS 6,441,298 B1 *   8/2002   Thio .................. 136/250
6,713,832 B2 *   3/2004   Pardo et al. ........... 257/459
7,351,374 B2 *   4/2008   Stark .................. 422/50
2007/0194357 A1 *  8/2007   Oohashi et al. ........ 257/292

FOREIGN PATENT DOCUMENTS

JP   2001-108524   4/2001
JP   2005-535121   11/2005

OTHER PUBLICATIONS

Tsutomu Ishi, et al. "Si Nano-Photodiode With A Surface Plasmon Antenna." *Japanese Journal of Applied Science*, vol. 44, No. 12, 2005, pp. L364-L366. published Mar. 4, 2005.

* cited by examiner

Primary Examiner—Stephen Yam
(74) Attorney, Agent, or Firm—Drinker Biddle & Reath LLP

(57) ABSTRACT

When light is made incident into antenna layers 11a, 11b, and 11c of a photodetector 1, specific wavelength components of light contained in the incident light combine with surface plasmons of the antenna layers 11a, 11b, and 11c, and surface plasmon resonance occurs. Thereby, near-field lights are outputted from through-holes 13 of the antenna layers 11a, 11b, and 11c. The near-field light outputted from each through-hole 13 reaches a light absorbing layer 4 via light receiving surfaces 4a, 4b, and 4c. The light absorbing layer 4 generates a charge of an amount according to the amount of received light. Since cycle intervals $\Lambda a$, $\Lambda b$, and $\Lambda c$ of convex portions 12 in the antenna layers 11a, 11b, and 11c are different from each other, the wavelength component of light that combines with a surface plasmon differs in each of the antenna layers 11a, 11b, and 11c. Consequently, a plurality of wavelength components of light can be detected.

9 Claims, 10 Drawing Sheets

Fig. 3

| | CASE (1) | | | | CASE (2) | | | |
|---|---|---|---|---|---|---|---|---|
| $E_0$ (eV) | 1.0 | 1.5 | 2.0 | 2.5 | 1.0 | 1.5 | 2.0 | 2.5 |
| $\lambda_0$ (nm) | 1240 | 827 | 620 | 496 | 1240 | 827 | 620 | 496 |
| $\Lambda$ (nm) | 1234 | 815 | 601 | 466 | 1239 | 824 | 616 | 491 |

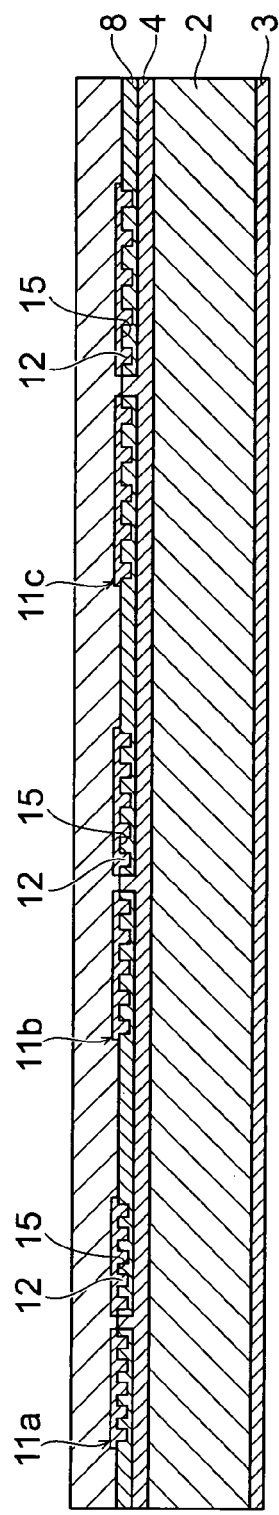
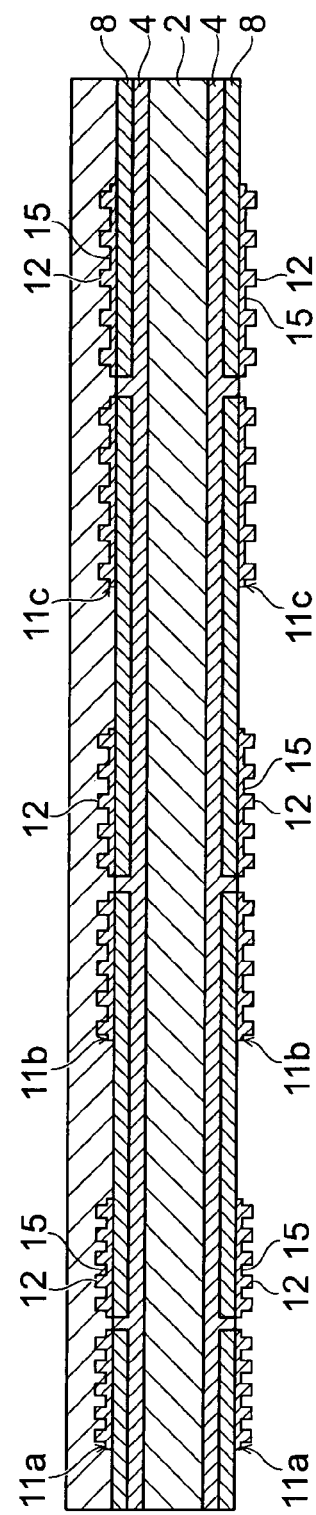

PHOTODETECTOR HAVING FIRST AND SECOND ANTENNA AREAS WITH PATTERNS HAVING DIFFERENT CYCLE INTERVALS

BACKGROUND OF THE INVENTION

1. Field of the Invention

The present invention relates to a photodetector.

2. Related Background Art

As one type of conventional photodetectors, for example, as described in Patent Document 1 (Japanese Published Unexamined Patent Application No. 2001-108524), known is one including a diffraction grating element that splits an incident light into a plurality of wavelength components and a light receiving element that receives each wavelength component of light via a collimator lens. In addition, a photodetector including a plurality of wavelength selection filters in place of a diffraction grating element is also known.

SUMMARY OF THE INVENTION

The photodetector disclosed in Patent Document 1 is complicated in device configuration and large-sized since this uses a diffraction grating element and a collimator lens. On the other hand, also when wavelength selection filters are used, a mechanism to exchange a plurality of wavelength selection filters is required, and thus the photodetector is still complicated in device configuration and large-sized.

It is therefore an object of the present invention to provide a photodetector that is simple in device configuration and compact.

The photodetector according to the present invention includes: (1) a semiconductor substrate; (2) a light receiving layer, formed on the semiconductor substrate, having a light receiving surface, and generating charge of an amount according to an amount of received light; and (3) a plurality of antenna layers, formed on the light receiving layer, having a through-hole opposed to the light receiving surface of the light receiving layer, and producing surface plasmon resonance, wherein patterns following predetermined rules are respectively formed on surfaces of the plurality of antenna layers, and on at least two of the plurality of antenna layers, the patterns are different from each other.

The photodetector according to the present invention includes antenna layers that produce surface plasmon resonance. When a light (hv) is made incident into an antenna layer, a specific wavelength component of light contained in the incident light (hv) combines with a surface plasmon of the antenna layer, so that surface plasmon resonance occurs. When the surface plasmon resonance occurs, an intensive near-field light is outputted from the through-hole of the antenna layer. The intensity of the near-field light is proportional to the intensity of the light combined with a surface plasmon and greater than the same. The near-field light outputted from the through-hole of the antenna layer is received by the light receiving layer via the light receiving surface. The light receiving layer generates a charge of an amount according to the light receiving amount. Thus, by the photodetector of the present invention, a specific wavelength component of light contained in the light (hv) incident into the antenna layer can be detected. Moreover, the light receiving layer receives a near-field light, and the near-field light is greater in intensity than the specific wavelength component of light, that is, the light that combines with a surface plasmon. Therefore, in comparison with when the light receiving layer has directly received the specific wavelength component of light, light detection sensitivity can be improved.

On the surface of each antenna layer, formed is a pattern following predetermined rules. On at least two antenna layers, the patterns are different from each other. That is, at least two antenna layers have surface structures different from each other. It has been conventionally known that the wavelength component of light that combines with a surface plasmon differs according to the surface structure of the antenna layer. Consequently, in the photodetector of the present invention including the abovementioned antenna layers, at least two wavelength components of light contained in the incident light (hv) can be detected, respectively.

Thus, the photodetector of the present invention can detect a plurality of wavelength components of light, respectively. Since the photodetector of the present invention is a single element formed by laminating the semiconductor substrate, the light receiving layer, and the antenna layers, this is very compact and simple in device configuration, in comparison with a photodetector including a diffraction grating element, wavelength selection filters, or the like and a light receiving element separately. Moreover, by forming the light receiving layer and the antenna layers monolithically, the manufacturing steps can be simplified. Furthermore, since the plurality of antenna layers can be formed of an identical material as it is unnecessary to form these of a plurality of materials in order to differentiate the wavelength component of light that combines with a surface plasmon, the manufacturing cost can be controlled.

Moreover, in the photodetector according to the present invention, it is preferable that each antenna layer has a plurality of convex portions and a concave portion located between the convex portions, the convex portion and the concave portion form the pattern, and the through-hole is provided in the concave portion. In this case, by appropriately changing the position and the like of the convex portions, the shape of the pattern can be changed.

Moreover, in the photodetector according to the present invention, it is preferable that each antenna layer has a plurality of through-holes, and the plurality of through-holes form the pattern. In this case, by appropriately changing the position and the like of the through-holes, the shape of the pattern can be changed.

Moreover, in the photodetector according to the present invention, it is preferable that the convex portions are arranged at predetermined intervals, and the predetermined intervals are different from each other in at least two of the plurality of antenna layers. Since the antenna layers that are thus different in the arranging interval of the convex portions from each other are assuredly different in the shape of the pattern on the surface, the wavelength component of light that combines with a surface plasmon can be assuredly differentiated. Consequently, a plurality of wavelength components of light can be reliably detected, respectively.

Moreover, in the photodetector according to the present invention, it is preferable that the through-holes are arranged at predetermined intervals, and the predetermined intervals are different from each other in at least two of the plurality of antenna layers. When the photodetector thus includes a plurality of antenna layers different in the arranging interval of the through-holes as well, a plurality of wavelength components of light can be reliably detected, respectively.

Moreover, in the photodetector according to the present invention, it is preferable that a width of the through-hole is shorter than a wavelength of an incident light. By thus narrowing the width of the through-hole, a near-field light can be reliably outputted from the through-hole.

Moreover, in the photodetector according to the present invention, it is preferable that the light receiving layer is applied with a bias voltage to both surfaces thereof. In this case, it becomes possible to output a charge generated in the light receiving layer as current signals.

According to the present invention, a photodetector that is simple in device configuration and compact can be provided.

BRIEF DESCRIPTION OF THE DRAWINGS

FIG. 3 is a table showing a relationship between the wavelength of light and cycle interval of an antenna layer.

FIG. 7A is a view showing a modification of the photodetector.

FIG. 7B is a view showing a modification of the photodetector.

DESCRIPTION OF THE PREFERRED EMBODIMENTS

Figure 1:
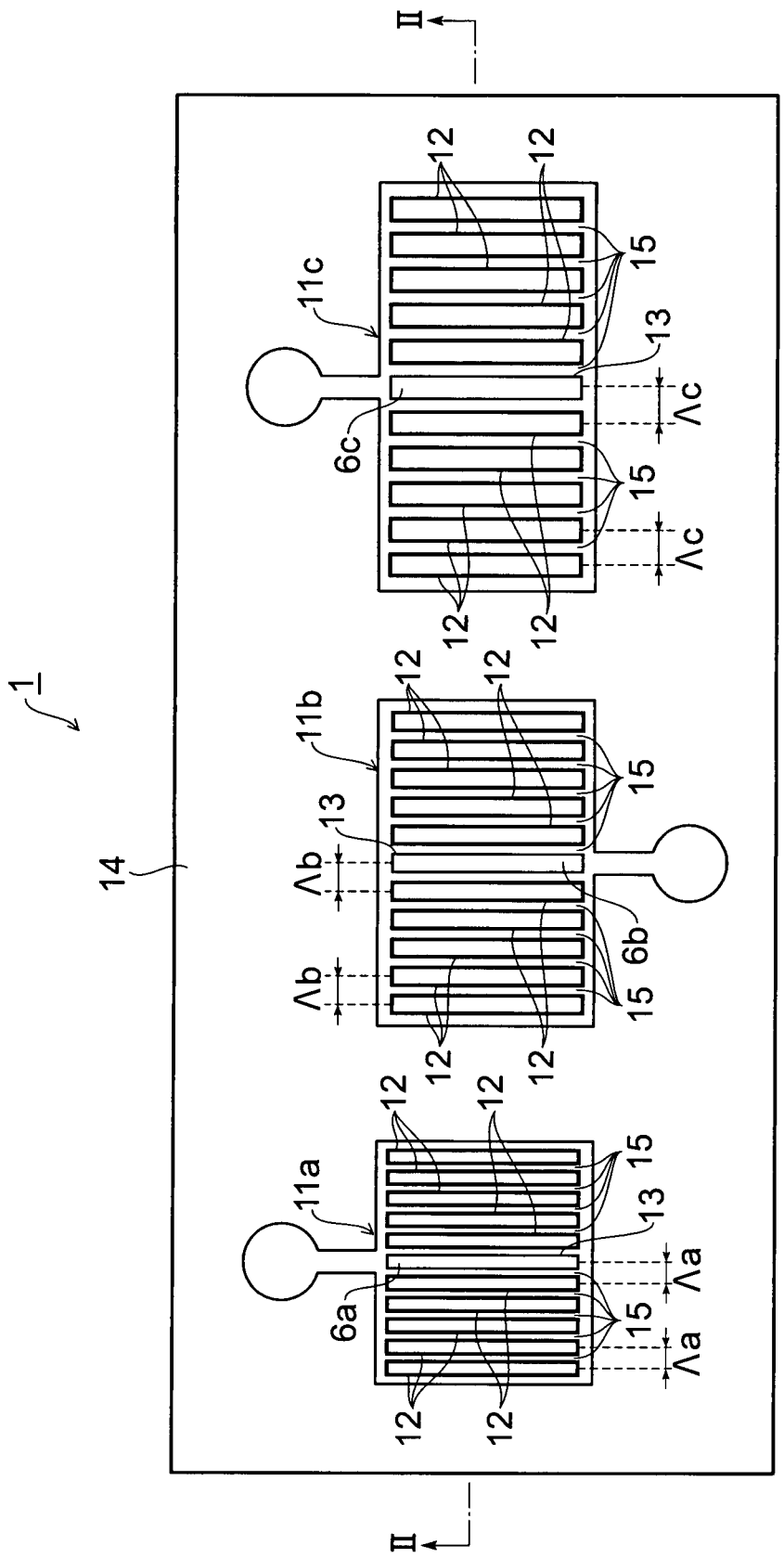
FIG. 1 is a plan view showing a configuration of a photodetector by the present invention.

Hereinafter, a preferred embodiment of a photodetector according to the present invention will be described in detail with reference to the drawings. Here, the words such as "upper" and "lower" are based on conditions shown in the drawings and used for the sake of convenience.

Figure 2:
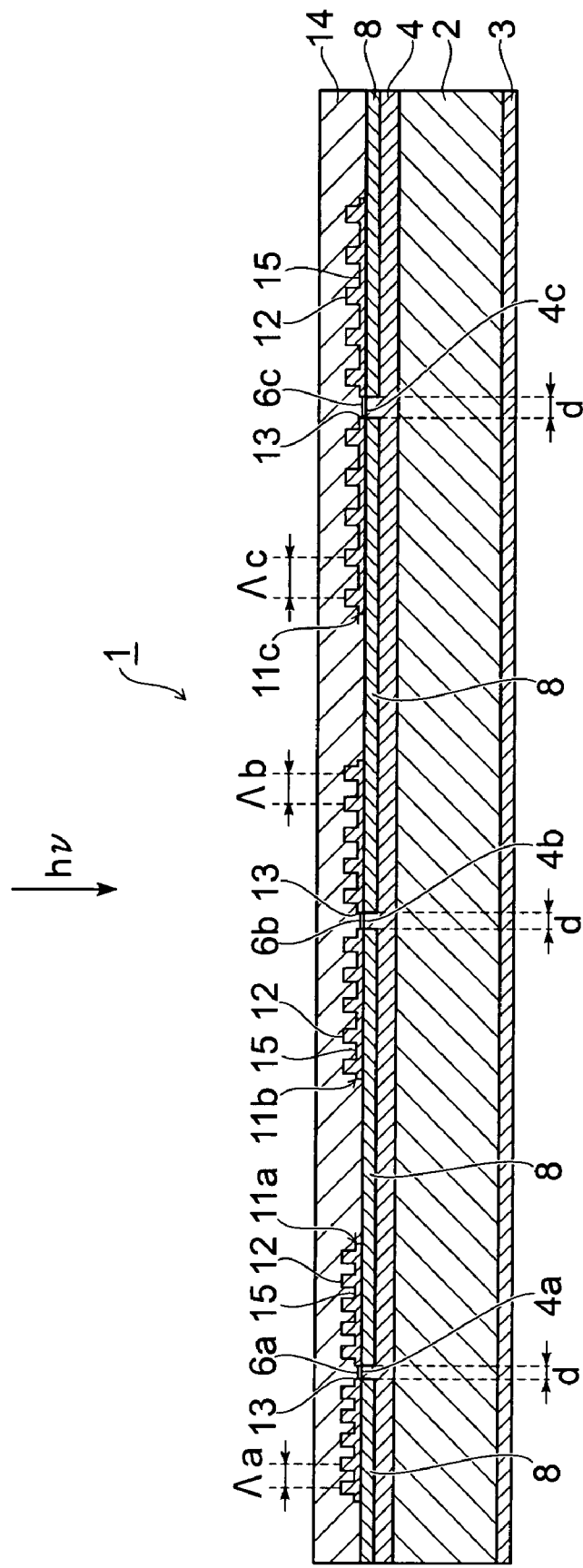
FIG. 2 is a sectional view along a line II-II of the photodetector shown in FIG. 1.

FIG. 1 is a plan view showing a configuration of a photodetector by the present invention, and FIG. 2 is a sectional view along a line II-II of the photodetector shown in FIG. 1.

As shown in FIG. 2, a photodetector 1 includes a semiconductor substrate 2, an electrode layer 3, a light absorbing layer (light receiving layer) 4, Schottky electrodes 6a, 6b, and 6c, a first insulating layer 8, and a plurality of (in the present embodiment, three) antenna layers (antenna areas) 11a, 11b, and 11c, and a second insulating layer 14.

The semiconductor substrate 2 is a substrate made of n-type silicon. On one principal surface of the semiconductor substrate 2, formed is the electrode layer 3, and on the other principal surface of the semiconductor layer 2, formed is the light absorbing layer 4.

The light absorbing layer 4 is a single layer containing n-type silicon. The light absorbing layer 4 has a plurality of (in the present embodiment, three) mesa-shaped portions, and surfaces located on the tops of the mesa-shaped portions are light receiving surfaces 4a, 4b, and 4c. When the light absorbing layer 4 is viewed from its upper surface, the light receiving surfaces 4a, 4b, and 4c display almost rectangular shapes. The light receiving surfaces 4a, 4b, and 4c are covered with the Schottky electrodes 6a, 6b, and 6c. The Schottky electrodes 6a, 6b, and 6c are very thin, and have a thickness to an extent making it possible to transmit light outputted from through-holes 13 of the antenna layers 11a, 11b, and 11c to be described later.

The first insulating layer 8 covers a part of the upper surface of the light absorbing layer 4 excluding the light receiving surfaces 4a, 4b, and 4c. Via the first insulating layer 8, formed in an array form on the light absorbing layer 4 are the three antenna layers 11a, 11b, and 11c.

The antenna layers 11a, 11b, and 11c are layers that produce surface plasmon resonance. The antenna layers 11a, 11b, and 11c contain a conductive material. As the conductive material contained, although Al, Ag, Au, Cr, and the like are preferable, a material other than these may be contained. The antenna layers 11a, 11b, and 11c each have a plurality of convex portions or projections 12 and concave portion or depressions 15 located between the convex portions 12. In the concave portion 15, the through-hole 13 is provided.

The through-hole 13 of the antenna layer 11a is opposed to the light receiving surface 4a of the light absorbing layer 4, and the through-hole 13 of the antenna layer 11b, to the light receiving surface 4b of the light absorbing layer 4, and the through-hole 13 of the antenna layer 11c, to the light receiving surface 4c of the light absorbing layer 4. As shown in FIG. 1, when the antenna layers 11a, 11b, and 11c are viewed from their upper surfaces, each through-hole 13 displays an almost rectangular shape. Here, each through-hole 13 has a short-side length (width) d shorter than the wavelength of a light (hv) made incident into the antenna layers 11a, 11b, and 11c. By thus forming the through-hole 13 narrow, a near-field light (to be described later in detail) produced in the antenna layers 11a, 11b, and 11c can be reliably outputted from the through-hole 13. Here, since the through-hole 13 in the present application is used for outputting a near-field light, this is not limited to a physical hole but includes also an optical hole (opening that transmits light).

Similar to the through-hole 13, the plurality of convex portions 12 display almost rectangular shapes. By the plurality of convex portions 12 and the concave portion 15 located between the convex portions 12, formed on each surface of the antenna layers 11a, 11b, and 11c is a pattern following predetermined rules. Therefore, by changing the position and shape of the convex portions 12 and the concave portion 15, the shape of the pattern is also changed. In the present embodiment, by changing the arranging interval of the convex portions 12, the patterns on the surfaces of the antenna layers 11a, 11b, and 11c are differentiated from each other.

More concretely, as shown in FIG. 1, in the antenna layers 11a, 11b, and 11c, the convex portions 12 are one-dimensionally arranged so that their long sides are opposed to each other. In addition, the convex portions 12 are arranged symmetrically with respect to the through-hole 13 being centered and at predetermined intervals. To describe the predetermined intervals more concretely, in, for example, the antenna layer 11a, a center distance between the convex portions 12 adjoining without sandwiching the through-hole 13 therebetween is Λa, while a center distance between the convex portions 12 adjoining while sandwiching the through-hole 13 therebetween is twice as long as Λa.

With regard to the antenna layers 11b and 11c as well, center distances between the convex portions 12 adjoining without sandwiching the through-hole 13 therebetween are Λb and Λc, respectively, while center distances between the convex portions 12 adjoining while sandwiching the through-hole 13 therebetween are twice as long as Λa and Λc, respectively. Hereinafter, these center distances Λa, Λb, and Λc are referred to as cycle intervals.

The cycle interval Λa in the antenna layer 11a, the cycle interval Λb in the antenna layer 11b, and the cycle interval Λc in the antenna layer 11c have values different from each other. Since the cycle intervals Λa, Λb, and Λc are different, patterns different from each other are to be formed on the surfaces of the antenna layers 11a, 11b, and 11c. The cycle intervals Λa, Λb, and Λc are set appropriately according to the wavelength component of light wished to be detected.

Here, description will be given of the values of the cycle intervals Λa, Λb, and Λc. It is considered that a light having a wavelength $\lambda_0$ ($=2\pi c/\omega$) is made incident almost vertical to any of the antenna layers 11a, 11b, and 11c (hereinafter, referred to as an antenna layer 11). In this case, it is sufficient, in order to produce surface plasmon resonance on the antenna layer 11, that a cycle interval Λ of the antenna layer 11 satisfies the following expression (1).

$$\Lambda = m\lambda_0 \sqrt{\frac{\varepsilon_a + \varepsilon_{metal}}{\varepsilon_a \times \varepsilon_{metal}}} \quad (1)$$

$\varepsilon_a$ denotes a relative permittivity of a dielectric that contacts with the antenna layer 11, and $\varepsilon_a=1$ in a vacuum. $\varepsilon_{metal}$ denotes a relative permittivity of the antenna layer 11, and $\varepsilon_{metal}>1$. Consequently, the following expression (2) can be derived.

$$\Lambda < \lambda_0 \quad (2)$$

According to expression (2), the antenna layer 11 produces surface plasmon resonance when the wavelength $\lambda_0$ of light is longer than the cycle interval Λ.

A relationship between the cycle interval Λ and the wavelength $\lambda_0$ of light when m shown in expression (1) is provided as 1 and the antenna layer 11 is formed of Ag or Al is shown in FIG. 3. CASE (1) shows data (photon energy $E_0$ (eV), wavelength $\lambda_0$ (nm), and cycle interval Λ (nm)) when Ag is used for the antenna layer 11, and CASE (2) shows data when Al is used for the antenna layer 11. According to FIG. 3, the antenna layer 11 having a cycle interval Λ=1234 nm produces surface plasmon resonance with a light having a wavelength $\lambda_0$=1240 nm. In the present embodiment, the cycle intervals Λa, Λb, and Λc are set so that the antenna layer 11a produces surface plasmon resonance with a light having a wavelength $\lambda_a$, and the antenna layer 11b, with a light having a wavelength $\lambda_b$, and the antenna layer 11c, with a light having a wavelength $\lambda_c$.

Figure 4A:
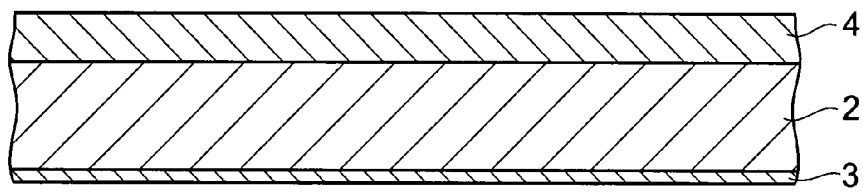
FIG. 4A is a sectional view showing a manufacturing step of the photodetector shown in FIG. 1.

Then, description will be given of manufacturing steps of the photodetector 1. First, as shown in FIG. 4A, prepared is the semiconductor substrate 2 on whose one principal surface the electrode layer 3 has been formed. On the other principal surface of the semiconductor substrate 2, the light absorbing layer 4 is laminated.

Figure 4B:
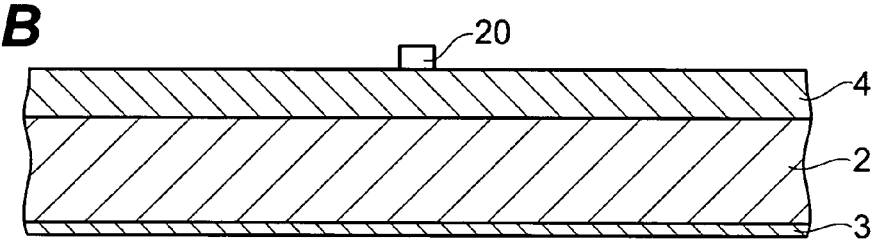
FIG. 4B is a sectional view showing a manufacturing step of the photodetector shown in FIG. 1.
Figure 4C:
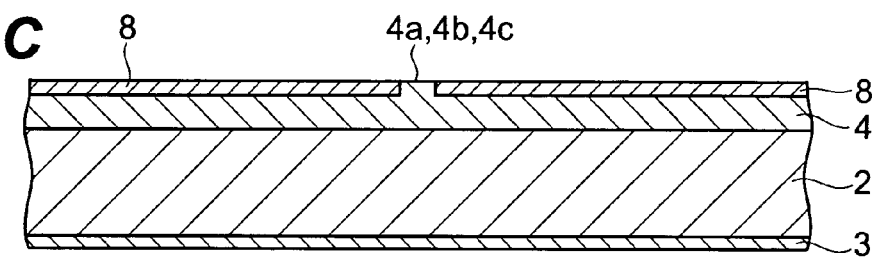
FIG. 4C is a sectional view showing a manufacturing step of the photodetector shown in FIG. 1.

Next, as shown in FIG. 4B, after applying a photoresist 20 on the light absorbing layer 4, by carrying out exposure using an unillustrated photomask and a development process, patterning of the photoresist 20 is carried out so as to cover an area where the light receiving surfaces 4a, 4b, and 4c are formed. And, as shown in FIG. 4C, by thermal-oxidizing the light absorbing layer 4 using this photoresist 20 as a mask, the first insulating layer 8 is formed. After forming the first insulating layer 8, the photoresist 20 is removed.

Figure 4D:
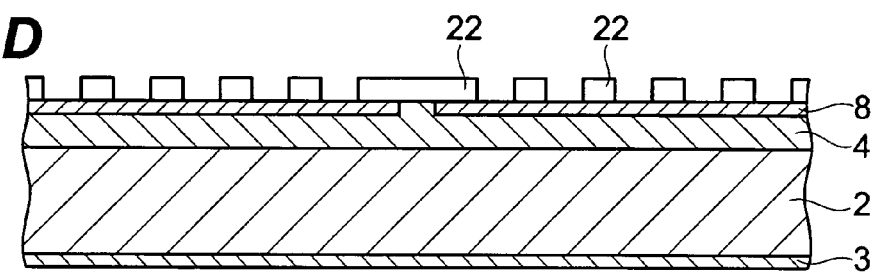
FIG. 4D is a sectional view showing a manufacturing step of the photodetector shown in FIG. 1.
Figure 4E:
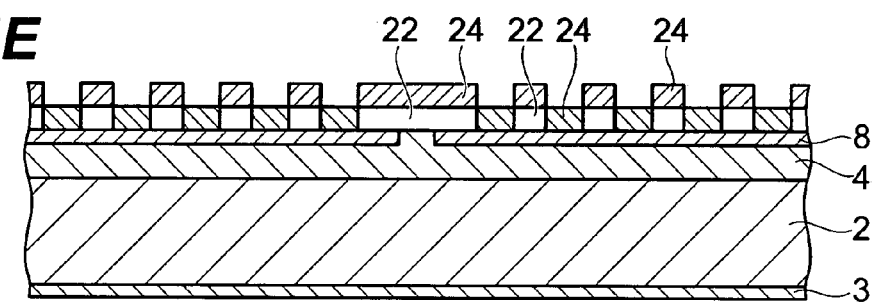
FIG. 4E is a sectional view showing a manufacturing step of the photodetector shown in FIG. 1.

Next, as shown in FIG. 4D, after applying a photoresist 22, by carrying out exposure using an unillustrated photomask and a development process, patterning of the photoresist 22 is carried out so as to open areas where the convex portions 12 are formed. And, as shown in FIG. 4E, on the first insulating layer 8 and light absorbing layer 4 masked by the photoresist 22, a conductive film 24 is formed by vapor deposition.

Figure 5A:
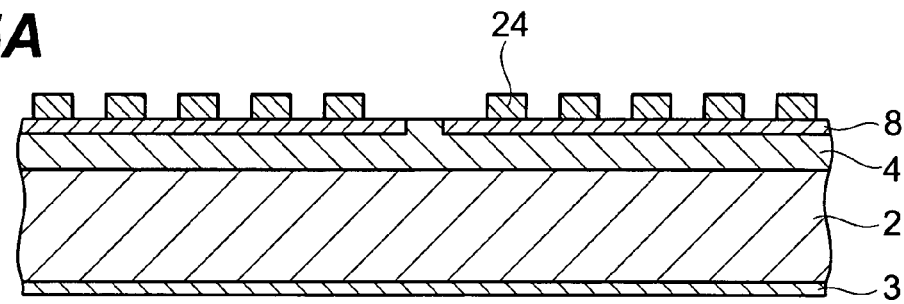
FIG. 5A is a sectional view showing a manufacturing step of the photodetector shown in FIG. 1.
Figure 5B:
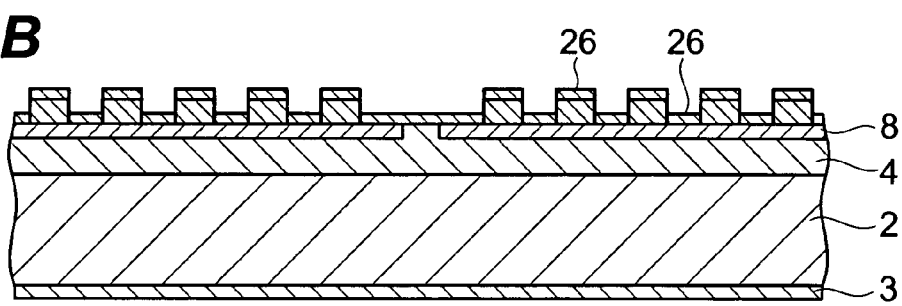
FIG. 5B is a sectional view showing a manufacturing step of the photodetector shown in FIG. 1.

Next, as shown in FIG. 5A, of the conductive film 24, a part formed on the photoresist 22 is removed by lift-off together with the photoresist 22. After the lift-off removal, as shown in FIG. 5B, a conductive film 26 is formed by vapor deposition. Thereby, the convex portions 12 and the concave portions 15 are formed.

Figure 5C:
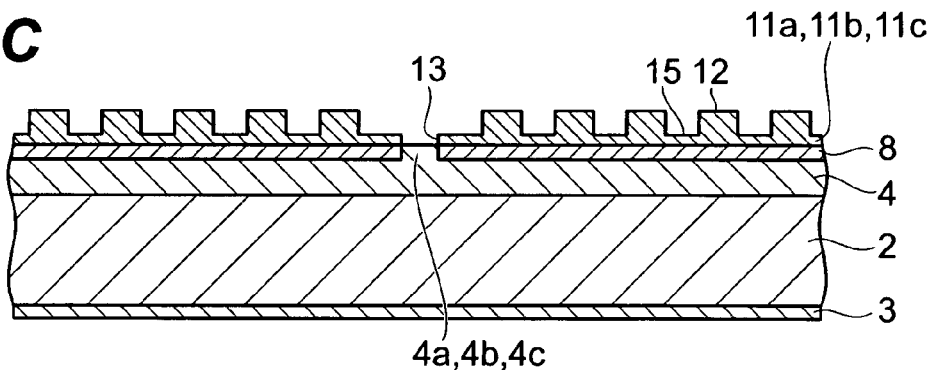
FIG. 5C is a sectional view showing a manufacturing step of the photodetector shown in FIG. 1.

After forming the conductive film 26, as shown in FIG. 5C, by irradiating focused ion beams onto parts of the conductive film 26 that exist on the light receiving surfaces 4a, 4b, and 4c, the conductive films 26 of these parts are removed. Thereby, the through-holes 13 are formed. Through the steps of FIG. 4D to FIG. 5C, antenna layers 11a, 11b, and 11c are laminated on the light absorbing layer 4.

Figure 5D:
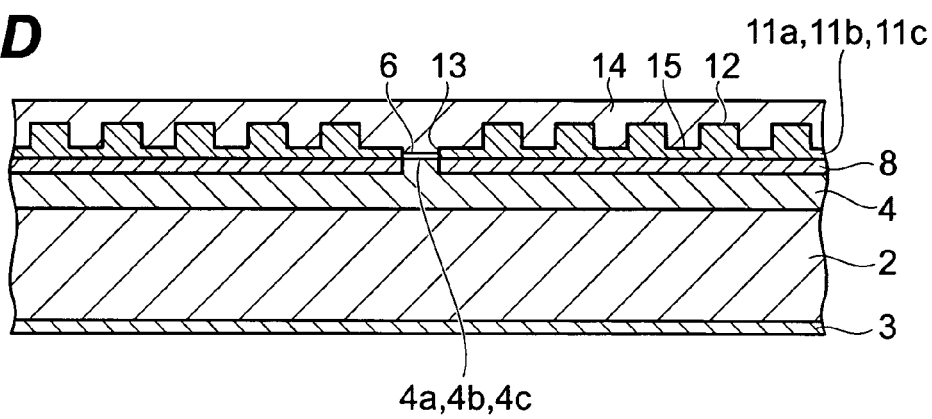
FIG. 5D is a sectional view showing a manufacturing step of the photodetector shown in FIG. 1.

Next, as shown in FIG. 5D, Schottky electrodes 6a, 6b, and 6c are formed by vapor deposition on the light receiving surfaces 4a, 4b, and 4c of the light absorbing layer 4. After forming the Schottky electrodes 6a, 6b, and 6c, by laminating the second insulating layer 14 on the antenna layers 11a, 11b, and 11c, the photodetector 1 shown in FIG. 1 and FIG. 2 is completed.

Then, description will be given of operations of the photodetector 1. When a light (hv) is made incident from the second insulating layer 14 side, a surface plasmon of the antenna layer 11a combines with a light having a wavelength λa contained in the incident light (hv). Moreover, a surface plasmon of the antenna layer 11b combines with a light having a wavelength λb contained in the incident light (hv), and a surface plasmon of the antenna layer 11c combines with a light having a wavelength %c contained in the incident light (hv). As a result, surface plasmon resonance occurs on the antenna layers 11a, 11b, and 11c.

When the surface plasmon resonance occurs, the antenna layers 11a, 11b, and 11c output intensive near-field lights from the through-holes 13. The intensity of the near-field light outputted by the antenna layer 11a is proportional to the intensity of the light having a wavelength λa and greater than the intensity of the light having a wavelength λa. The same applies to the intensities of the near-field lights outputted by the antenna layers 11b and 11c, and these are respectively proportional to the intensities of the lights having wavelengths λb and λc and greater than intensities of the lights having wavelengths λb and λc. The light absorbing layer 4 lying under the antenna layers 11a, 11b, and 11c receives the near-field lights outputted by the antenna layers 11a, 11b, and 11c. The light absorbing layer 4 generates a charge of an amount according to the intensity (light receiving amount) of the near-field light.

To both surfaces of the light absorbing layer 4, applied is a bias voltage by an external circuit. This makes it possible to take out the charge generated in the light absorbing layer 4 from the Schottky electrodes 6a, 6b, and 6c as current signals. The bias voltage is applied between the antenna layer 11a and the electrode layer 3, between the antenna layer 11b and the electrode layer 3, and between the antenna layer 11c and the electrode layer 3, in order.

When the bias voltage is applied between the antenna layer 11a and the electrode layer 3, a charge generated by the near-field light from the antenna layer 11a, that is, a charge of an amount according to the intensity of the light having a wavelength $\lambda a$, is outputted to the outside from the Schottky electrode 6a as a current signal. When the bias voltage is applied between the antenna layer 11b and the electrode layer 3, a charge generated by the near-field light from the antenna layer 11b, that is, a charge of an amount according to the intensity of the light having a wavelength $\lambda b$, is outputted to the outside from the Schottky electrode 6b as a current signal. When the bias voltage is applied between the antenna layer 11c and the electrode layer 3, a charge generated by the near-field light from the antenna layer 11c, that is, a charge of an amount according to the intensity of the light having a wavelength $\lambda c$, is outputted to the outside from the Schottky electrode 6c as a current signal.

Figure 6:
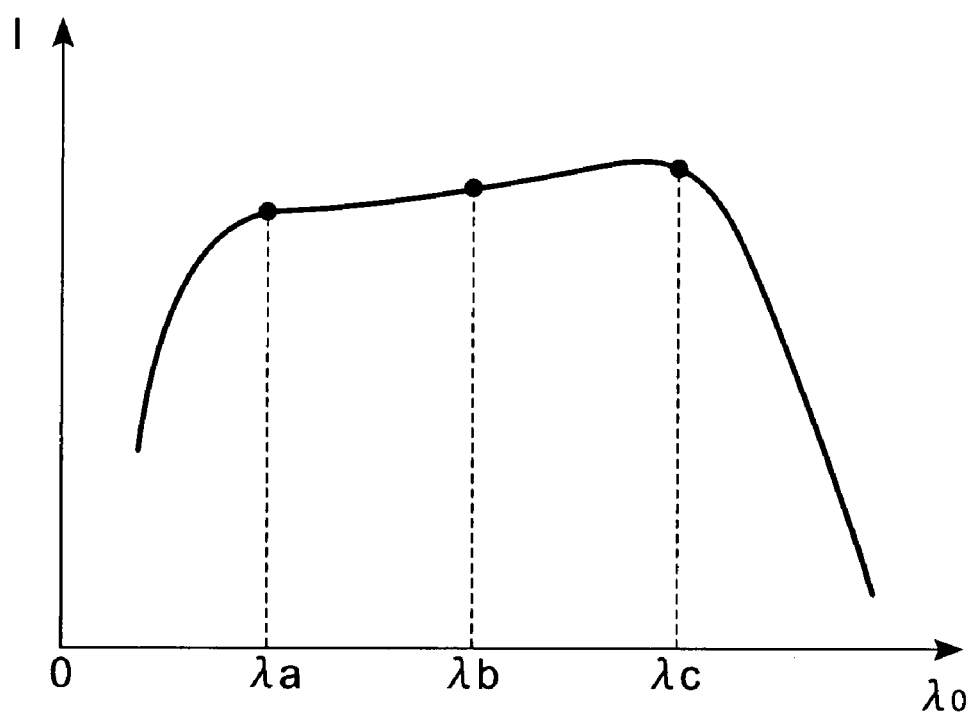
FIG. 6 is a graph showing a result of measurement by the photodetector shown in FIG. 1.

In this manner, by outputting the current signals from the Schottky electrodes 6a, 6b, and 6c, in order, the measurement result as shown in the graph of FIG. 6 showing a relationship between the wavelength ($\lambda_o$) and intensity (I) can be obtained. Here, the order of applying the bias voltage is not limited to the above.

As described above, the photodetector 1 according to the present embodiment is a single element formed by laminating the semiconductor substrate 2, the light absorbing layer 4, and the antenna layers 11a, 11b, and 11c. When a light (hv) is made incident into the antenna layers 11a, 11b, and 11c of the photodetector 1, specific wavelength components of light contained in the incident light (hv) combine with surface plasmons of the antenna layers 11a, 11n, and 11c, so that surface plasmon resonance occurs. When the surface plasmon resonance occurs, intensive near-field lights are outputted from the through hole 13 of the antenna layers 11a, 11b, and 11c. The near-field lights reach the light absorbing layer 4 via the light receiving surfaces 4a, 4b, and 4c. The light absorbing layer 4 generates a charge of an amount according to the intensity of the received light.

On the surfaces of the antenna layer 11a, 11b, and 11c, formed are patterns following predetermined rules by the plurality of convex portions 12 and the concave portion 15 located between the convex portions 12. The patterns are different from each other among the antenna layers 11a, 11b, and 11c. This is because the cycle intervals $\Lambda a$, $\Lambda b$, and $\Lambda c$ of the antenna layers 11a, 11b, and 11c are different from each other. Being different in the surface pattern means being different in the surface structure, and therefore, the wavelength components of light that combine with surface plasmons are also different from each other among the antenna layers 11a, 11b, and 11c. As a result, a plurality of wavelength components of light (above-described wavelengths $\lambda a$, $\lambda b$, and $\lambda c$) can be detected, respectively.

Since the photodetector 1 is a single element, this is very compact and simple in device configuration, in comparison with a photodetector including a diffraction grating element, wavelength selection filters, or the like and a light receiving element separately. Moreover, by forming the light absorbing layer 4 and the antenna layers 11a, 11b, and 11c monolithically, the manufacturing steps can be simplified. Moreover, since the antenna layers 11a, 11b, and 11c can be formed of an identical material, the manufacturing cost can be controlled. Moreover, the light absorbing layer 4 receives a near-field light, however, the near-field light is greater in intensity than the specific wavelength components of light (light having the above-described wavelengths $\lambda a$, $\lambda b$, and $\lambda c$) that produce surface plasmon resonance. Therefore, in comparison with when the light absorbing layer 4 has directly received the specific wavelength components of light, light detection sensitivity can be improved.

The present invention is not limited to the abovementioned embodiment and can be variously modified. Although, for example, the light absorbing layer 4 in the present embodiment has been provided as a single layer, the light absorbing layer may have a laminated structure and may have a heterostructure layer. Moreover, although the light absorbing layer 4 in the present embodiment has been provided as a layer containing n-type silicon, this may contain semiconductors other than the n-type silicon such as Ge, SiC, and a diamond semiconductor, may contain III-V compound semiconductors such as GaAs, GaP, InP, InAs, InSb, GaN, AlN, and InN and mixed crystals thereof, and may contain II-VI compound semiconductors such as ZnO, ZnSe, ZnS, CdSe, CdS, HgCd, HgTe and mixed crystals thereof, or organic semiconductors. These are appropriately selected according to a wavelength component of light wished to be detected and a usage of the photodetector.

Moreover, although the light absorbing layer 4 in the present embodiment has been provided as a layer formed on the semiconductor substrate 2, this may be formed on a transparent substrate having insulation such as glass or sapphire.

Moreover, although the photodetector 1 of the present embodiment 1 has been provided as a so-called Schottky type with the Schottky electrodes 6a, 6b, and 6c formed on the light receiving surfaces 4a, 4b, and 4c of the light absorbing layer 4, this may be a PN junction type or a photoconductive type. When the photodetector 1 is provided as a PN junction type or a photoconductive type, the light receiving surfaces 4a, 4b, and 4c may be exposed without providing the Schottky electrodes 6a, 6b, and 6c.

Moreover, although the electrode layer 3 in the present embodiment has been provided as a layer formed on one principal surface of the semiconductor substrate 2, this may be formed on the other principal surface of the semiconductor substrate 2 together with the antenna layers 11a, 11b, and 11c. In this case, the photodetector 1 displays a planar-type-structure.

Moreover, the convex portions 12 and the concave portions 15 on the antenna layer 11a, 11b, and 11c in the present embodiment may be formed on the second insulating layer 14 side as shown in FIG. 2, and may be formed on the first insulating layer 8 side as shown in FIG. 7A.

Figure 8:
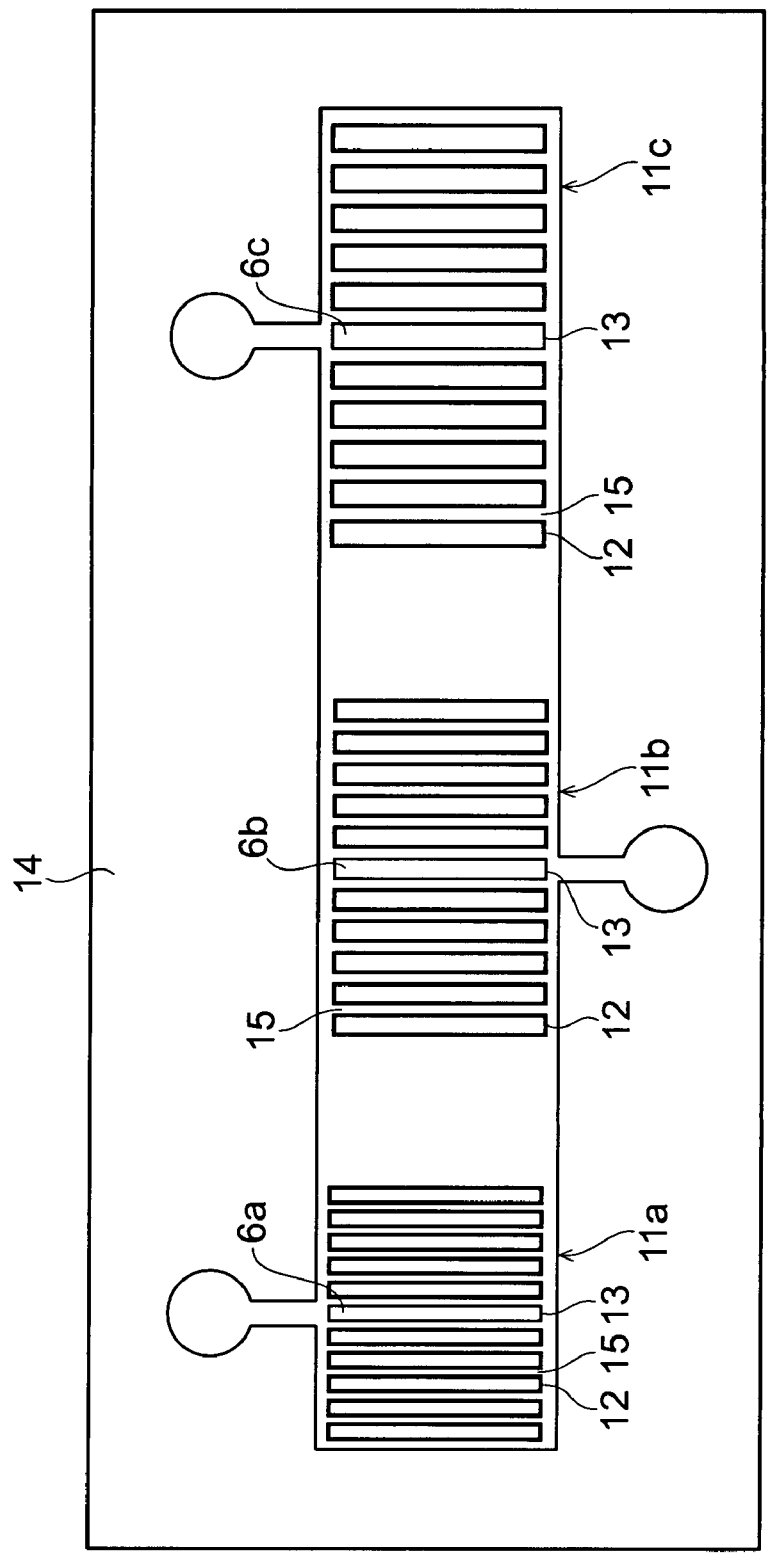
FIG. 8 is a view showing a modification of the antenna layer.

Moreover, although the antenna layers 11a, 11b, and 11c of the present embodiment have been provided on the other principal surface of the semiconductor substrate 2, these may also be formed on one principal surface of the semiconductor substrate 2 as shown in FIG. 7B. Moreover, around the antenna layers 11a, 11b, and 11c, a Bragg reflection layer may be formed. Moreover, the antenna layers 11a, 11b, and 11c may be integrally formed as shown in FIG. 8.

Moreover, although the photodetector 1 of the present embodiment has been provided as a photodetector including the three antenna layers 11a, 11b, and 11c, the number of antenna layers is not limited thereto. When the photodetector includes more antenna layers different in the surface pattern, it becomes possible to detect more wavelength components of light. Moreover, when the photodetector includes a plurality of antenna layers identical in the surface pattern, it becomes possible to detect a low light by superimposed outputs from the respective antenna layers.

Figure 9A:
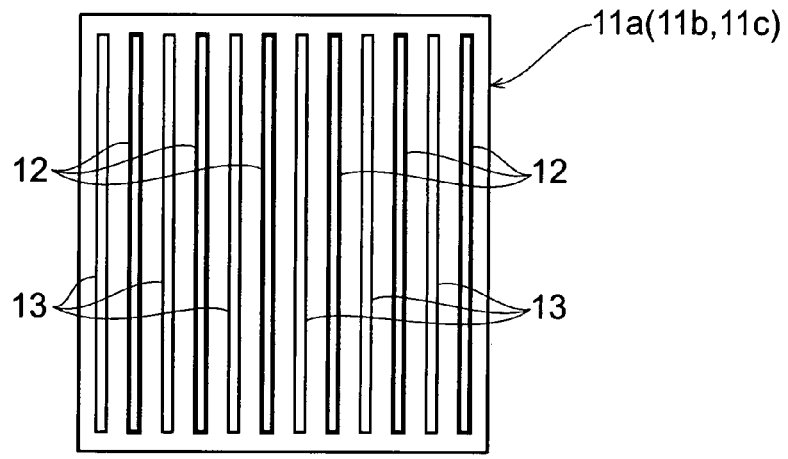
FIG. 9A is a view showing a modification of the antenna layer.
Figure 9B:
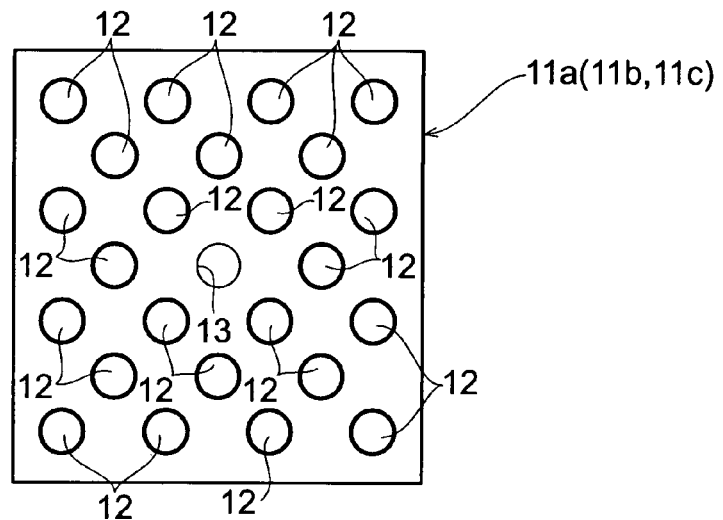
FIG. 9B is a view showing a modification of the antenna layer.
Figure 9C:
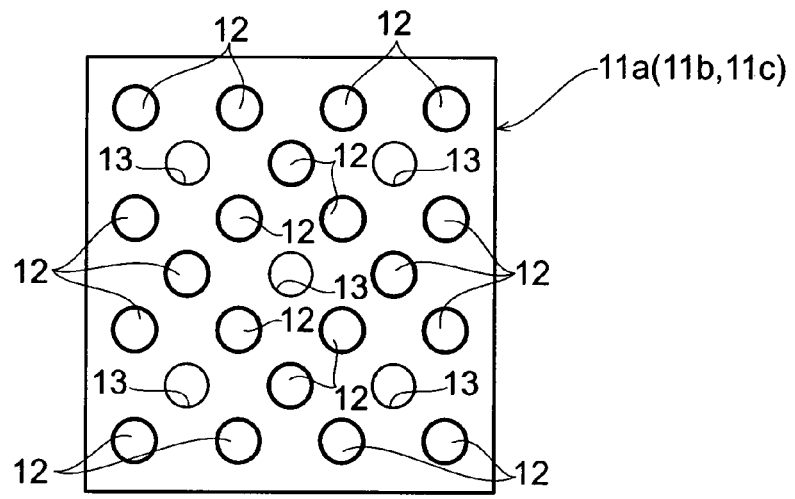
FIG. 9C is a view showing a modification of the antenna layer.
Figure 10A:
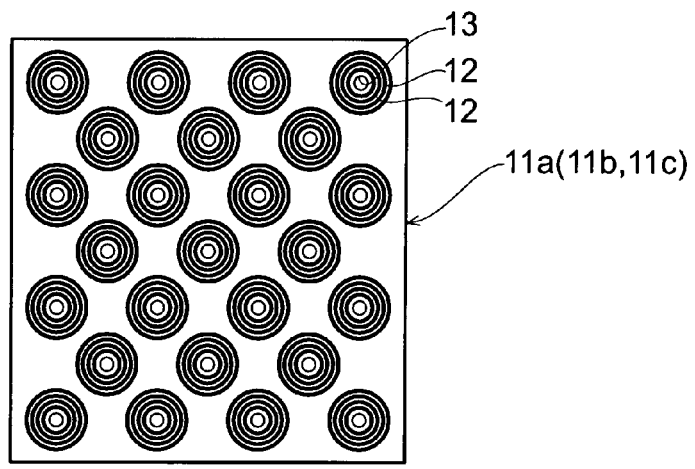
FIG. 10A is a view showing a modification of the antenna layer.
Figure 10B:
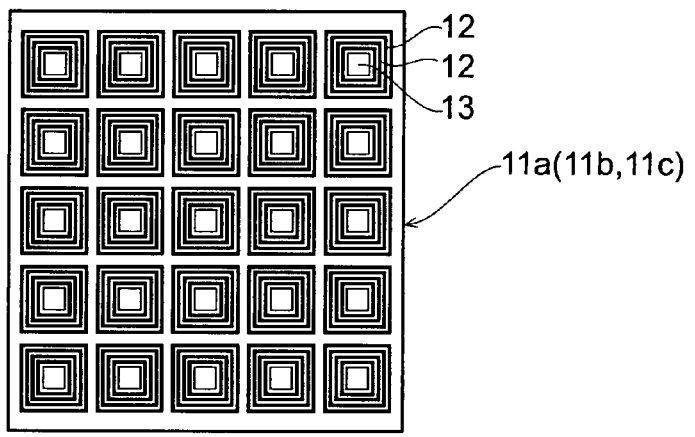
FIG. 10B is a view showing a modification of the antenna layer.

Moreover, the patterns on the surfaces of the antenna layers 11a, 11b, and 11c are not limited to those of the present embodiment. These may be, for example, as shown in FIG. 9A, patterns formed by one-dimensionally arranging almost rectangular-shaped convex portions 12 at equal intervals and providing an almost rectangular-shaped through-hole 13 in each concave portion 15 located between the convex portions 12. Moreover, these may be, as shown in FIG. 9B, patterns formed by two-dimensionally arranging almost circular-shaped convex portions 12 at equal intervals around an almost circular-shaped through-hole 13 being centered, and may be, as shown in FIG. 9C, patterns formed by two-dimensionally arranging almost circular-shaped through-holes 13 and almost circular-shaped convex portions 12 alternately and at equal intervals. Moreover, these may be, as shown in FIG. 10A, patterns formed by two-dimensionally arranging dart-board (also called a bullseye)-shaped designs composed of a through-hole 13 and a plurality of convex portions 12 at predetermined intervals. FIG. 10B shows a pattern of the designs in FIG. 10A deformed into almost rectangular shapes.

Figure 10C:
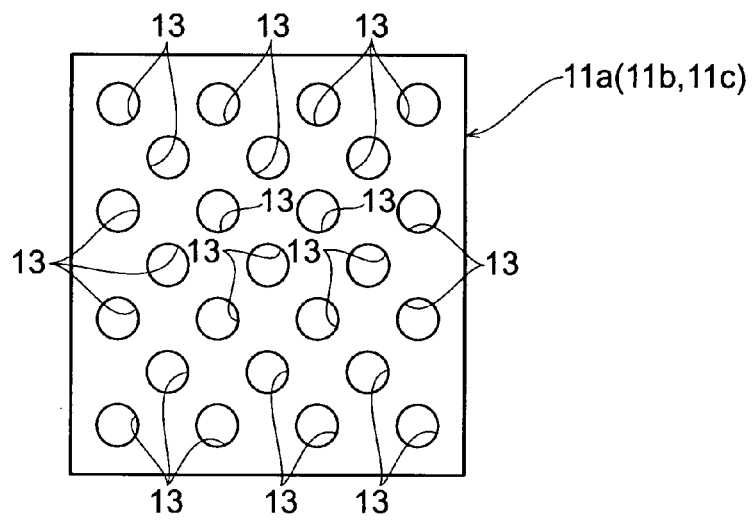
FIG. 10C is a view showing a modification of the antenna layer.

Moreover, in the photodetector 1 of the present embodiment, it has been provided that the patterns on the surfaces of the antenna layers 11a, 11b, and 11c are formed by a plurality of convex portions 12 and a concave portion 15 located between the convex portions 12. This may be changed so that the patterns on the surfaces of the antenna layers 11a, 11b, and 11c are formed by a plurality of through-holes 13. When, as shown in FIG. 10C, the patterns on the surfaces of the antenna layers 11a, 11b, and 11c are formed by two-dimensionally arranging the through-holes 13 at equal intervals (predetermined intervals), the shape of the pattern in each of the antenna layers 11a, 11b, and 11c can be changed by changing the position and arranging interval of the through-holes 13. Here, in the modifications shown in FIG. 9A to FIG. 9C and FIG. 10A to FIG. 10C, a light receiving surface of the light absorbing layer 4 is formed under each through-hole 13.

Moreover, although, in the photodetector 1 of the present embodiment, it has been provided that a bias voltage is applied by an external circuit between the antenna layers 11a, 11b, and 11c and the electrode layer 3, in order, however, in place of the external circuit, a shift resistor circuit or the like for sequentially applying a bias voltage may be provided in the photodetector 1. Moreover, the photodetector 1 of the present embodiment may further include a current/voltage converting circuit. In this case, current signals outputted via the Schottky electrodes 6a, 6b, and 6c can be externally outputted after a conversion to voltage signals. Moreover, the photodetector 1 of the present embodiment may further include a circuit for correcting a fluctuation in sensitivity characteristics due to a change in temperature and the like.

What is claimed is:

1. A photodetector comprising:
    a semiconductor substrate;
    a light receiving layer, formed on the semiconductor substrate, having a light receiving surface, and generating charge of an amount according to an amount of received light; and
    physically separated first and second antenna areas formed in a plane on the light receiving layer, each of the first and second antenna areas having a through-hole opposed to the light receiving surface of the light receiving layer, and producing surface plasmon resonance, wherein
    periodic patterns are respectively formed on surfaces of the first and second antenna areas,
    the patterns respectively formed on the first and second antenna areas are different from each other, and
    respective cycle intervals of the periodic patterns of the first and second antenna areas are different from each other.

2. The photodetector according to claim 1,
    wherein each of the first and second antenna areas has a plurality of projections and depressions forming the pattern of the respective antenna area, and the through-hole of each antenna area is provided in one of the depressions.

3. The photodetector according to claim 1,
    wherein each of the first and second antenna areas has a plurality of through-holes, and the plurality of through-holes for the first and second antenna areas form the pattern of the respective antenna area.

4. The photodetector according to claim 3, wherein the through-holes are arranged at predetermined intervals, and the predetermined intervals are different from each other in the first and second antenna areas.

5. The photodetector according to claim 1,
    wherein a width of each through-hole is shorter than a wavelength of an incident light incident on the photodetector.

6. The photodetector according to claim 1,
    wherein the light receiving layer comprises two surfaces and is applied with a bias voltage to both surfaces thereof.

7. The photodetector according to claim 1,
    wherein each of the cycle intervals of the respective periodic patterns of the first and second antenna areas is defined by a center distance between neighboring projections of the respective first and second antenna areas.

8. A photodetector comprising:
    a semiconductor substrate;
    a light absorbing layer, formed on the semiconductor substrate; and
    physically separated first and second antenna areas formed in a plane on the light absorbing layer and producing surface plasmon resonance in response to an incident light, wherein
    periodic patterns are formed on surfaces of the respective first and second antenna areas,
    the patterns respectively formed on the first and second antenna areas are different from each other, and
    respective cycle intervals of the periodic patterns of the first and second antenna areas are different from each other.

9. The photodetector according to claim 8,
    wherein each of the cycle intervals of the respective periodic patterns of the first and second antenna areas is defined by a center distance between neighboring projections of the respective first and second antenna areas.

* * * * *